United States Patent
Weis et al.

(10) Patent No.: US 7,795,109 B2
(45) Date of Patent: Sep. 14, 2010

(54) ISOLATION TRENCHES WITH CONDUCTIVE PLATES

(75) Inventors: Rolf Weis, Dresden (DE); Thomas D. Happ, Dresden (DE)

(73) Assignee: Qimonda AG, Munich (DE)

( * ) Notice: Subject to any disclaimer, the term of this patent is extended or adjusted under 35 U.S.C. 154(b) by 114 days.

(21) Appl. No.: 12/144,482

(22) Filed: Jun. 23, 2008

(65) Prior Publication Data

US 2009/0315090 A1    Dec. 24, 2009

(51) Int. Cl.
*H01L 21/76* (2006.01)
(52) U.S. Cl. ............... 438/430; 438/381; 438/438; 257/296; 257/374
(58) Field of Classification Search ......... 438/381, 438/430, 438; 257/296, 374, 510, E29.001
See application file for complete search history.

(56) References Cited

U.S. PATENT DOCUMENTS

| | | | | |
|---|---|---|---|---|
| 6,087,705 | A * | 7/2000 | Gardner et al. | 257/510 |
| 6,566,228 | B1 * | 5/2003 | Beintner et al. | 438/430 |
| 7,304,341 | B2 * | 12/2007 | Mikawa et al. | 257/296 |
| 2004/0056324 | A1 * | 3/2004 | Ning et al. | 257/528 |
| 2004/0175897 | A1 * | 9/2004 | Wensley et al. | 438/386 |
| 2005/0009290 | A1 * | 1/2005 | Yan et al. | 438/424 |

* cited by examiner

*Primary Examiner*—Phuc T Dang
(74) *Attorney, Agent, or Firm*—Slater & Matsil, L.L.P.

(57) ABSTRACT

Methods of forming isolation trenches, semiconductor devices, structures thereof, and methods of operating memory arrays are disclosed. In one embodiment, an isolation trench includes a recess disposed in a workpiece. A conductive material is disposed in a lower portion of the channel. An insulating material is disposed in an upper portion of the recess over the conductive material.

28 Claims, 6 Drawing Sheets

ISOLATION TRENCHES WITH CONDUCTIVE PLATES

CROSS-REFERENCE TO RELATED APPLICATIONS

This application relates to the following co-pending and commonly assigned U.S. patent application Ser. No. 11/701,198, filed on Feb. 1, 2007, entitled "Resistive Memory Including Buried Wordlines"; Ser. No. 12/033,519, filed on Feb. 19, 2008, entitled "Integrated Circuit Including U-Shaped Access Device"; and Ser. No. 12/033,533, filed on Feb. 19, 2008, entitled "Integrated Circuit Including U-Shaped Access Device", which applications are hereby incorporated herein by reference.

TECHNICAL FIELD

The present invention relates generally to the fabrication of semiconductor devices, and more particularly to the fabrication of isolation regions.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Isolation regions are used in many semiconductor device applications to isolate adjacent active areas or devices from one another. Isolation regions are formed by patterning trenches or recesses in a substrate or workpiece, and filling the trenches with insulating materials. Some isolation regions comprise relatively high aspect ratio trenches formed in the substrate or workpiece, e.g., comprising an aspect ratio of up to 10:1, for example.

As features of semiconductor devices are decreased in size, as is the trend in the semiconductor industry, isolation regions may be insufficient to provide isolation for adjacent active areas or devices, for example. In memory devices, leakage current and parasitic effects may occur between adjacent devices, as examples.

Thus, what are needed in the art are improved methods of forming isolation regions of semiconductor devices and structures thereof.

SUMMARY OF THE INVENTION

These and other problems are generally solved or circumvented, and technical advantages are generally achieved, by preferred embodiments of the present invention, which provide novel methods of forming isolation trenches. The isolation trenches include a conductive plate that is electrically coupled to the substrate or workpiece at the lower portion of the trenches.

In accordance with one embodiment of the present invention, an isolation trench includes a recess disposed in a workpiece. A conductive material is disposed in a lower portion of the recess. An insulating material is disposed in an upper portion of the recess over the conductive material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
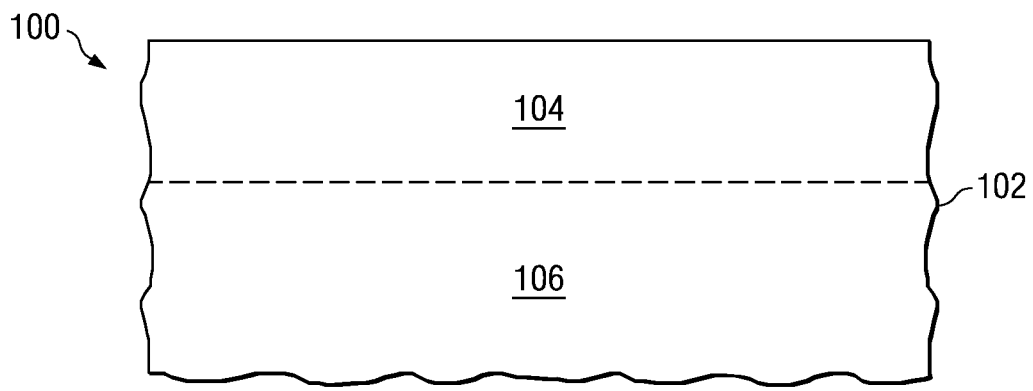
FIGS. 1 through 4 show cross-sectional views of a semiconductor device at various stages of manufacturing in accordance with an embodiment of the present invention, wherein isolation trenches are partially filled with a conductive plate, and the remainder of the isolation trenches are filled with an insulating material.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

There is a trend in semiconductor technology to reduce the size of devices, to improve performance and reduce power requirements, as examples. The minimum feature size or critical dimension (CD) of semiconductor devices continues to become smaller and smaller. For example, advanced technology nodes are developing 60 nm, 45 nm, and 32 nm CDs, and the trend in reducing CD's is expected to continue towards the 20 nm or less range.

Some features of semiconductor devices may comprise the minimum feature size or CD of a technology node, such as isolation regions, bitlines, and wordlines of memory arrays, which may comprise a minimum size on one side and extend lengthwise on another side, e.g., in a top view.

In semiconductor devices having small geometries, the size effect for wiring lines in a memory array becomes more and more critical. In addition, the distance between adjacent p-n junctions becomes smaller with reduced ground rules, so that latchup effects may become critical in large memory arrays. Attempts to avoid the latchup effects have involved suppression of such effects using highly doped wells, e.g., by forming epitaxial grown substrates. Isolation trenches may comprise long trenches filled with an insulating material between active areas, and current may tend to flow between adjacent active areas as dimensions are decreased. The resistivity of conductive lines such as wordline and bitlines can be high, resulting in a substantial voltage drop across an array, e.g., from an edge of the array to a memory device inside the array.

What are needed in the art are improved methods of fabricating isolation regions of semiconductor devices and structures thereof.

Embodiments of the present invention achieve technical advantages by providing novel methods of forming isolation trenches of semiconductor devices. The isolation trenches include a conductive material in a lower portion of the trenches. The conductive material comprises buried conductive lines within the isolation trenches that provide low ohmic conductive plates in memory arrays, disposed beneath the memory arrays.

The present invention will be described with respect to preferred embodiments in specific contexts, namely implemented in PCRAM arrays. Embodiments of the invention may also be implemented in other semiconductor applications such as other types of memory devices, such as dynamic random access memory (DRAM) devices, static random access memory (SRAM) devices, flash memory devices, or other resistive memory devices such as magnetic random access memory (MRAM) devices or transition metal oxide (TMO) devices, for example. Embodiments of the present invention may also be implemented in logic devices, mixed signal devices, analog devices, or other semiconductor device applications, for example.

FIGS. 1 through 4 show cross-sectional views of a semiconductor device 100 at various stages of manufacturing in accordance with a preferred embodiment of the present invention. To manufacture the semiconductor device 100, first, a workpiece 102 is provided. The workpiece 102 may include a semiconductor substrate, body, or workpiece comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A first doped region 104 and a second doped region 106 may be formed in the workpiece 102, using several methods. The first doped region 104 may comprise a p type region and the second doped region 106 may comprise an n type region, or the first doped region 104 may comprise an n type region and the second doped region 106 may comprise a p type region, for example. The differently doped first and second doped regions 104 and 106 may be formed using implantation processes, epitaxial growth processes, diffusion processes, or any combinations thereof.

For example, a wafer or workpiece 102 of a first dopant type may be provided, and a top surface of the workpiece 102 may be counter-doped, e.g., with a second dopant type, forming a first doped region 104. A second doped region 106 resides below the first doped region 104, the second doped region 106 comprising the first dopant type of the workpiece 102. Thus, the second doped region 106 is doped differently than the first doped region 104.

Alternatively, a wafer or workpiece 102 comprising a first dopant type may be provided, and a second dopant type may be implanted beneath the top surface of the workpiece 102, forming a second doped region 106 comprising a different dopant than the first doped region 104 residing beneath the first doped region 104.

Figure 8:
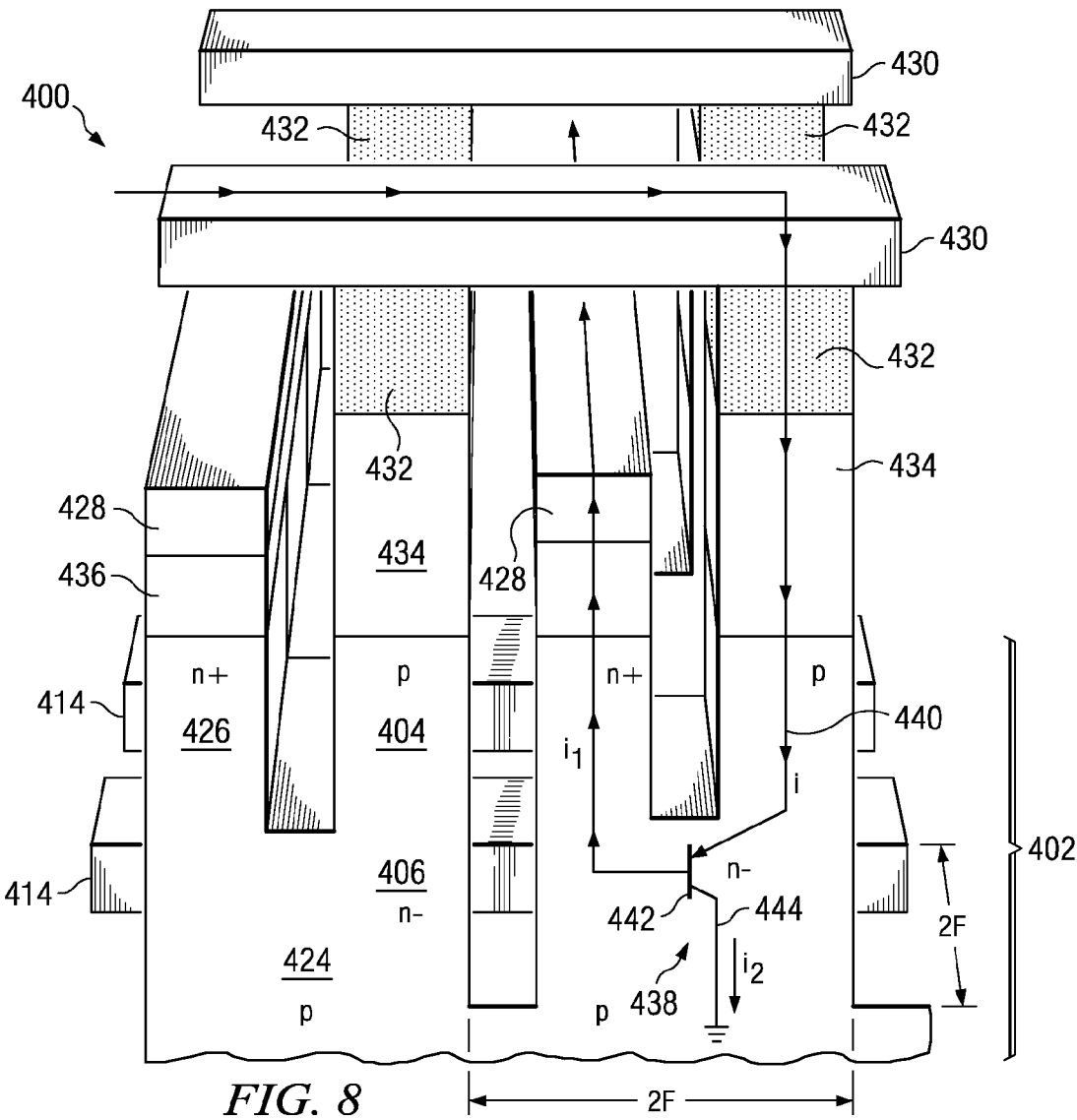
FIG. 8 shows a perspective view of an embodiment of the present invention implemented in a memory array comprising a phase change random access memory (PCRAM) including select devices comprising U-shaped bipolar transistors.
Figure 9:
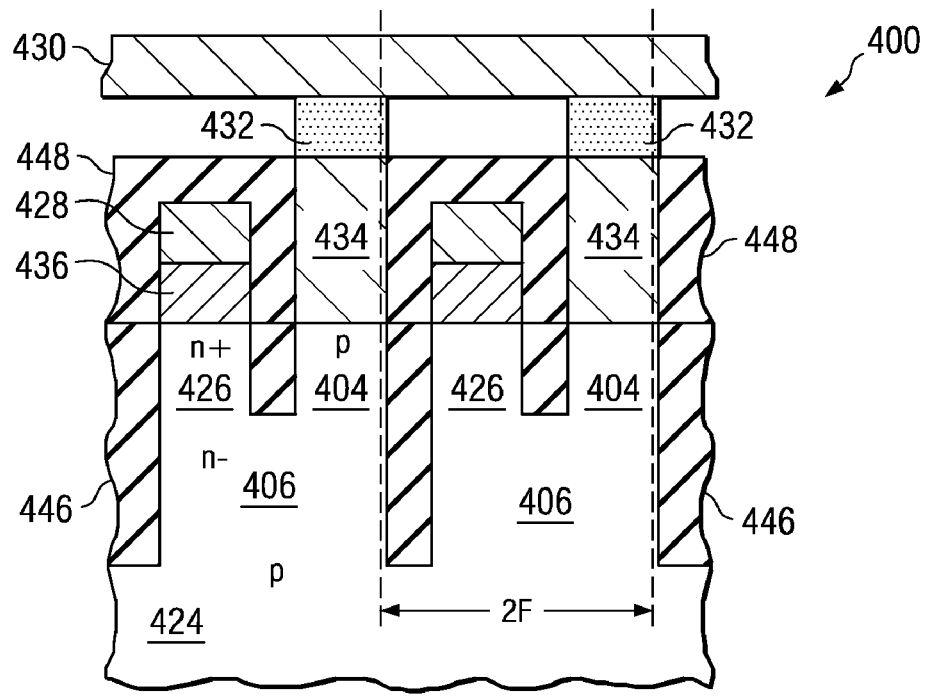
FIG. 9 shows a cross-sectional view of a portion of the memory array shown in FIG. 8.
Figure 10:
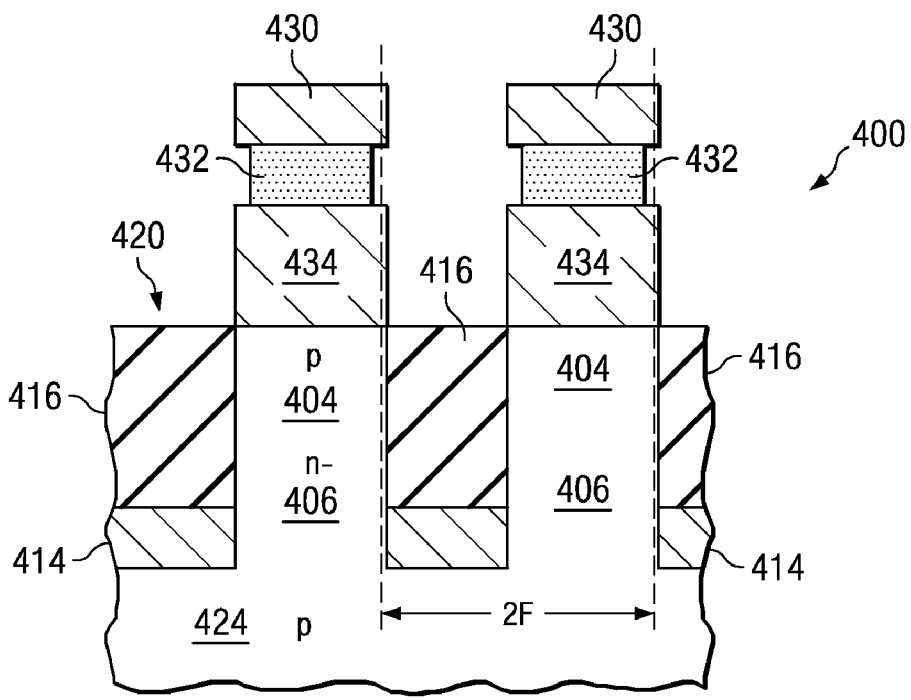
FIG. 10 shows a cross-sectional view of a portion of the memory array shown in FIGS. 8 and 9 rotated by ninety degrees.

Or, in another embodiment, an undoped workpiece 102 may be provided, and two implantation processes may be used to form the first doped region 104 and the second doped region 106. Alternatively, an undoped workpiece 102 may be provided, and the second doped region 106 and the first doped region 104 may be formed by two sequential epitaxial growth processes, as another example. Combinations of these methods may also be used to form the first doped region 104, the second doped region 106, and optional additional doped regions, as shown in the embodiments of FIGS. 8 through 10 at third doped region 424 and fourth doped region 426, for example.

Referring again to FIG. 1, the first doped region 104 and the second doped region 106 comprise different types of dopants and include a junction at an intersection thereof. The first doped region 104 may be p type and the second doped region 106 may be n type, or the first doped region 104 may be n type and the second doped region 106 may be p type, for example. The doping concentrations of the second doped region 106 are relatively high in some embodiments, for example. The differently doped first and second doped regions 104 and 106 provide a vertical doping profile for the semiconductor device 100. The first and second doped regions 104 and 106 may comprise at least a portion of an active area of the workpiece 102, for example.

Figure 2:
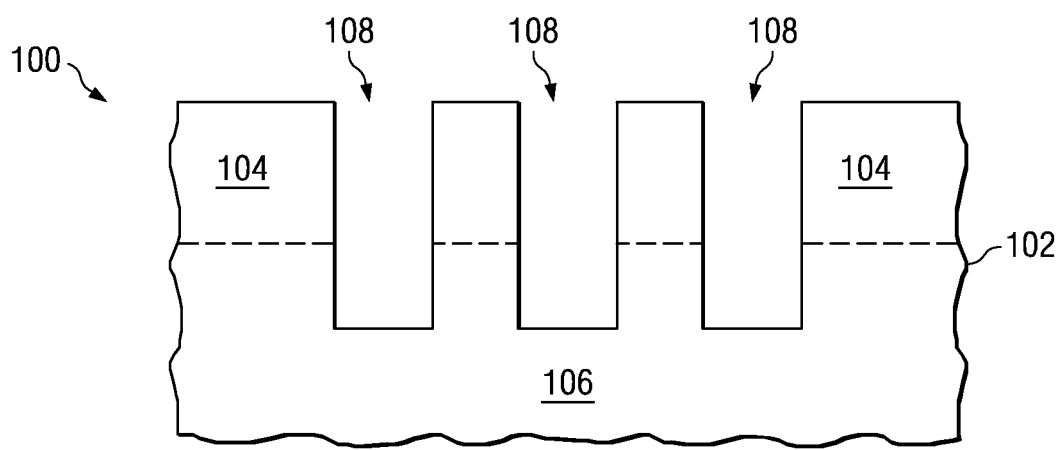

A plurality of recesses 108 or trenches are formed in the workpiece 102 in the first doped region 104 and the second doped region 106, as shown in FIG. 2. The recesses 108 may be formed by depositing a hard mask (not shown) over the workpiece 102 and forming recesses 108 in the workpiece 102 and the hard mask using a lithography process. Alternatively, or additionally, the workpiece 102 may include a pad nitride disposed thereon that the recesses 108 are also formed in, not shown.

For example, the recesses 108 may be formed by depositing a photoresist, patterning the photoresist using a lithography mask and an exposure process, developing the photoresist, removing portions of the photoresist, and then using the photoresist and/or hard mask or pad nitride to protect portions of the workpiece 102 while other portions are etched away, forming the recesses 108 in the workpiece 102. The etch process to form the recesses 108 may comprise a wet or dry etch process, and may comprise a reactive ion etch (RIE)

process in some embodiments, for example. The photoresist and the optional hard mask or pad nitride may be removed, or the hard mask or pad nitride may be left remaining over the workpiece 102 after the etch process to form the recesses 108.

The recesses 108 may comprise a depth within a top surface of the workpiece 102 of about 200 to 400 nm, and may comprise a width of the minimum feature size or CD of the semiconductor device 100 or greater, although alternatively, the recesses 108 may comprise other dimensions. The recesses 108 may comprise a length, e.g., in and out of the paper, of several hundred nanometers to several µm or greater, as an example, although alternatively, the recesses 108 may comprise other dimensions. The length of the recesses 108 in and out of the paper may vary depending on the size of the array, e.g., 128×128 cells, up to over 2,000×2,000 cells, as examples. Alternatively, the recesses 108 may comprise other dimensions depending on the particular application and the technology node used for the manufacturing of the semiconductor device 100, for example.

The recesses 108 comprise voids or trenches formed in a top portion of the workpiece 102, e.g., in the first doped region 104 and the second doped region 106 of the workpiece 102, wherein isolation regions or isolation trenches will be formed in accordance with embodiments of the present invention, to be described further herein. Only three recesses 108 are shown in FIGS. 2 through 5; however, there may be a plurality of recesses 108 for isolation trenches formed across a surface of a workpiece 102 in accordance with embodiments of the present invention, for example, not shown. There may be hundreds or thousands of recesses 108 formed in a single memory array, depending on the size of the array, for example.

The recesses 108 comprise regions where isolation trenches will be formed in accordance with embodiments of the present invention. The recesses 108 are filled with a conductive material 110/112 in a lower portion of the recesses 108, as shown in FIGS. 3 and 4, and an upper portion of the recesses 108 is filled with an insulating material 116 as shown in FIG. 4, to be described further herein.

Figure 3:
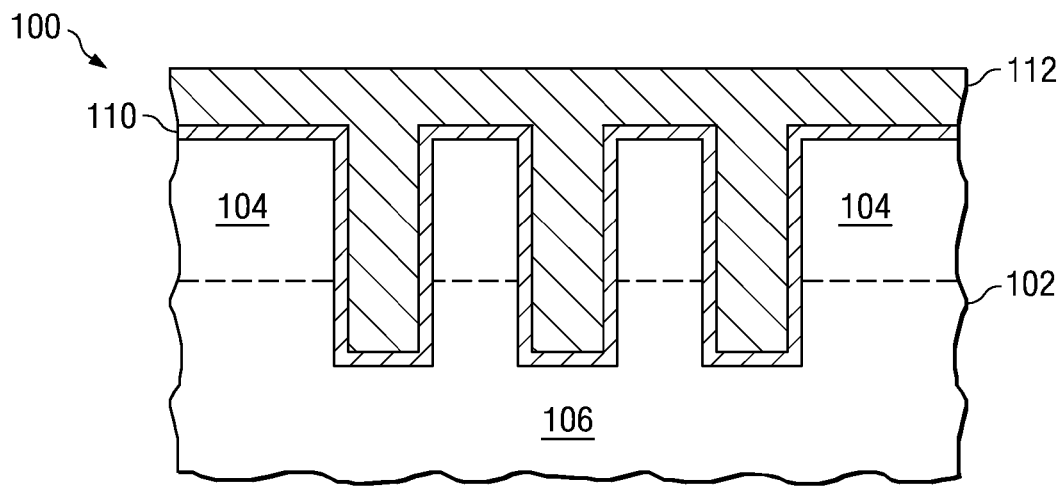
Figure 4:
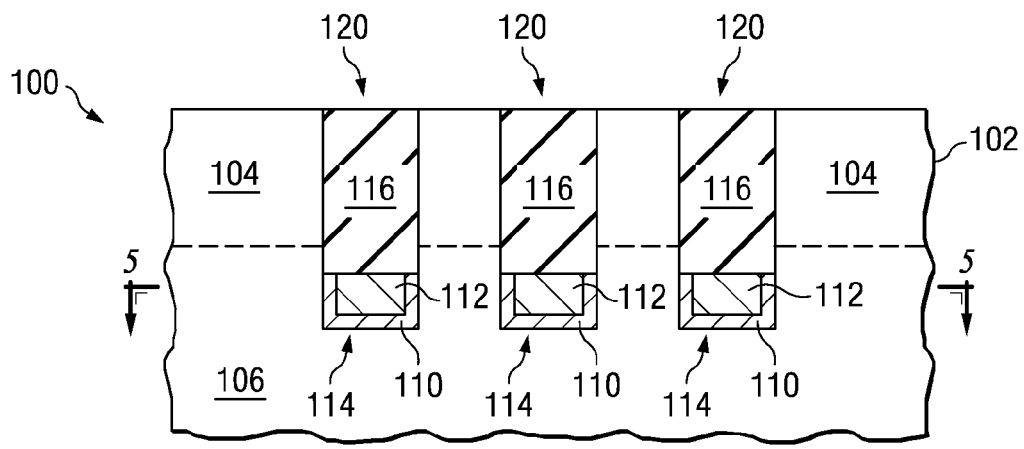
Figure 6:
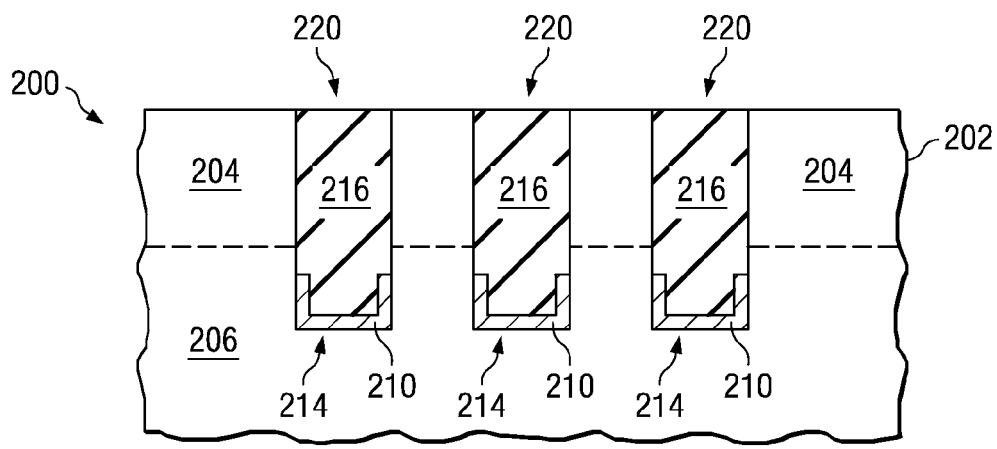
FIG. 6 shows an embodiment of the present invention wherein the conductive plates of the isolation trenches comprise a liner of a conductive material.

After forming the recesses 108 in the workpiece 102, an optional conductive liner 110 may be formed over the workpiece 102, lining the top surface of the workpiece, and sidewalls and bottom surfaces of the recesses 108, as shown in FIG. 3. The conductive liner 110 may comprise a metal in some embodiments that improves adhesion of a subsequently deposited conductive fill material 112 to the surface of the workpiece in the recesses 108, for example. Alternatively, the conductive liner 110 may comprise a conductive material that functions as a conductive plate 214, as shown in FIG. 6 at 210, to be described further herein.

Figure 7:
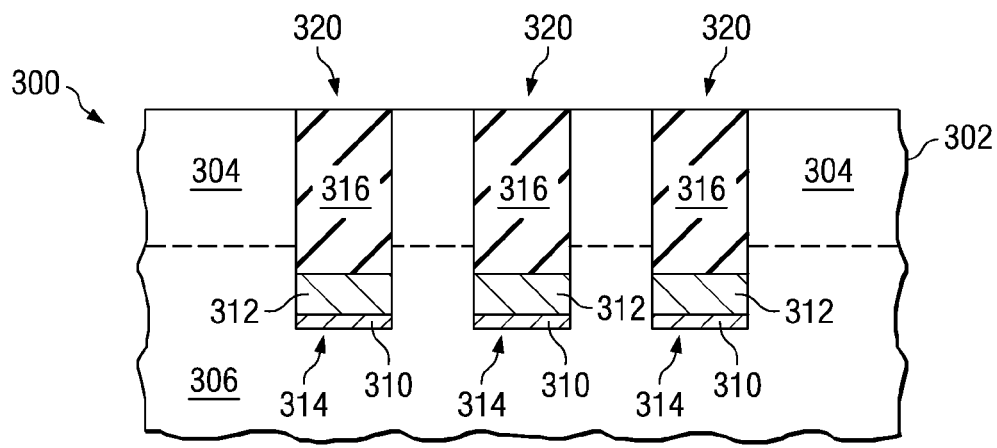
FIG. 7 shows an embodiment of the present invention, wherein a conductive liner is formed only on a bottom surface of the isolation trenches.

The conductive liner 110 may be deposited using chemical vapor deposition (CVD) or atomic layer deposition (ALD), substantially conformally coating the exposed surfaces of the workpiece 102, as shown in FIG. 3. Alternatively, the conductive liner 110 may be formed using a sputter process or physical vapor deposition (PVD), which may result in only the bottom surfaces of the recesses 108 being coated with the conductive liner, as shown in FIG. 7 at 310, also to be described further herein.

The conductive liner 110 may comprise a thickness of about 2 to 5 nm, for example, although alternatively, the conductive liner 110 may comprise other dimensions. The conductive liner 110 may be thicker, e.g., comprising a thickness of about 5 to 50 nm in other embodiments, if a conductive fill material is not used.

The conductive liner 110 may comprise a metal in some embodiments. The conductive liner 110 may comprise W, WN, WSi, Ti, TiN, Ta, TaN, other metals, combinations thereof, or multiple layers or liners thereof, as examples, although alternatively, the conductive liner 110 may comprise other materials.

A conductive fill material 112 is deposited over the workpiece 102, e.g., over the conductive liner 110, if present, as shown in FIG. 3. The conductive fill material 112 may extend over a top surface of the workpiece 102 as deposited, as shown. The conductive fill material 112 may be deposited using CVD or PVD, although other deposition methods may also be used to form the conductive fill material 112. The conductive fill material 112 may comprise W, WN, WSi, Ti, TiN, Ta, TaN, Ru, Pt, Ir, carbon, polysilicon, doped polysilicon, other semiconductive materials, a silicided semiconducting material such as TiSi, NiSi, CoSi, combinations thereof, or multiple layers or liners thereof, as examples, although alternatively, other materials may also be used for the conductive fill material 112.

In some embodiments, the conductive fill material 112 comprises a metal. In other embodiments, the conductive fill material 112 comprises a semiconductive material such as silicon. In embodiments wherein the conductive fill material 112 comprises a semiconductive material, the semiconductive material may be doped or silicided to form a material that has a lower resistivity to the surrounding bulk silicon of the workpiece 102, for example. The conductive fill material 112 may comprise a semiconductive material doped or silicided to form a low ohmic polysilicon material that forms a barrier to the surrounding bulk silicon of the workpiece 102 in some embodiments, for example.

The conductive fill material 112 is optional if the conductive liner 110 is used, e.g., in the embodiment shown in FIG. 6, a conductive fill material 112 is not included.

The conductive liner 110 and the conductive fill material 112 comprise conductive materials that comprise a lower resistance than the workpiece 102 in the lower portion of the recesses 108. For example, the conductive liner 110 and the conductive fill material 112 may comprise materials that comprise a lower ohmic material than the second doped region 106 of the workpiece 102, which may be heavily doped.

The conductive material 110/112 is removed from the upper portion of the recesses 108, as shown in FIG. 4. The conductive material 110/112 may be removed using a chemical mechanical polish process and/or a RIE process, as examples, although alternatively, other etching methods may be used to etch away the conductive material 110/112 from the upper portion of the recesses 108 in the workpiece 102. The conductive material 110/112 left remaining in the lower portion of the recesses 108 may comprise a thickness of about 10 to 50 nm in some embodiments, for example, although alternatively, the conductive material 110/112 in the lower portion of the recesses 108 may comprise other dimensions. The depth of the recesses 108 may be increased to accommodate for the presence of the conductive material 110/112 in the recesses 108, for example.

The conductive material 110/112 comprises a conductive plate 114 that is coupled to and makes electrical contact to the second doped region 106 of the workpiece 102. The conductive plate 114 is electrically coupled to the second doped region 106 in the lower portion of the workpiece 102. The conductive plate 114 comprising the conductive material 110/112 may be coupled to a return voltage terminal to assist in the functioning of the semiconductor device 100, to be described further herein. The conductive plate 114 has a lower resistance than a portion of the workpiece 102 proximate the lower portion of the recesses 108, e.g., a lower resistance than the second doped region 106 of the workpiece 102, in some embodiments.

An insulating material 116 is deposited over the workpiece 102, filling in the upper portion of the recesses 108, as shown in FIG. 4. The insulating material 116 may overfill the recesses 108 as deposited, and a CMP process may be used to planarize the workpiece 102 and remove a portion of the insulating material 116 from over the top surface of the workpiece 102, or from over the top surface of a pad nitride or hard mask, if present, for example. The insulating material 116 may comprise a dielectric material such as an oxide material, a nitride material, a low dielectric constant (k) dielectric material having a dielectric constant of less than 3.9, $Al_2O_3$, or multiple layers or combinations thereof, as examples, although alternatively, the insulating material 116 may comprise other materials.

The insulating material 116 and the conductive plate 114 comprising the conductive material 110/112 in the recesses 108 comprise isolation trenches 120, as shown in FIG. 4. The isolation trenches 120 isolate active areas of the workpiece 102 between the isolation trenches 120 from one another, for example. The isolation trenches 120 are also referred to herein as isolation regions. The isolation regions 120 may comprise shallow trench isolation (STI) regions, deep trench (DT) isolation regions, field oxide isolation regions, or other insulating regions, as examples.

The active areas of the workpiece 102 that the isolation trenches 120 provide isolation for may comprise the first doped regions 104 and the second doped regions 106 of the workpiece 102 in some embodiments, for example. The active areas may also comprise additional doped regions and may comprise other types of regions formed in the workpiece 102, for example. The active areas may comprise diodes or transistors in some embodiments, to be described further herein.

Figure 5:
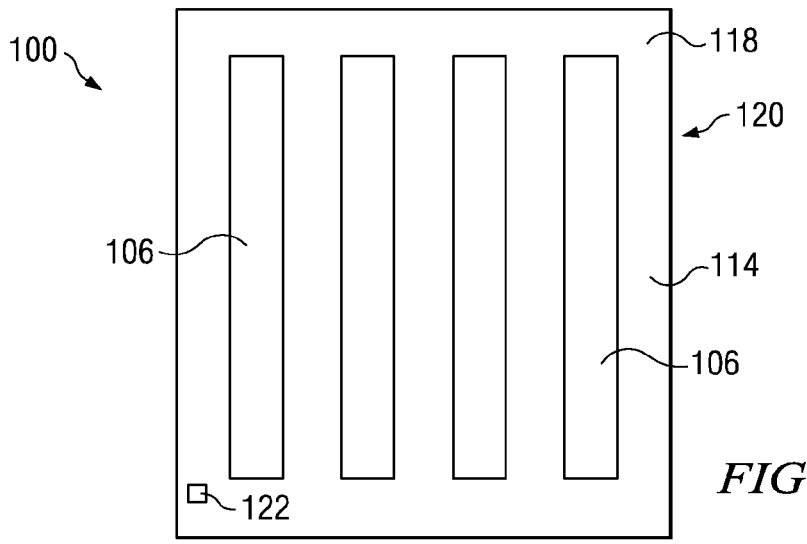
FIG. 5 shows a top view of a portion of the isolation trenches comprising the conductive plates.

FIG. 5 shows a top view of a portion of the isolation trenches 120 comprising the conductive plates 114 shown in FIG. 4 in the view at 5-5. The conductive material 110/112 comprising the conductive plates 114 of the isolation regions 120 between each active area in the workpiece 102 (e.g., between the second doped regions 106 of the workpiece 102) may be coupled together by conductive lines 118 formed in the same material layer of the workpiece 102 that the conductive material 110/112 is formed in. The conductive plates 114 comprise a lines and spaces pattern in the top view of the workpiece 102, for example.

All of the conductive plates 114 may be coupled together in a single memory array in some embodiments, as shown in FIG. 5. In other embodiments, only some of the conductive plates may be coupled together, for example. The conductive plates 114 are directly connected to silicon of the workpiece 102, e.g., to the second doped region 106 in the embodiment shown in FIGS. 1 through 5. The second doped region 106 may comprise highly doped n or p type crystalline silicon in some embodiments, for example.

The conductive plates 114 comprising the conductive material 110/112 may be coupled to a voltage return terminal, e.g., using a contact or via 122 disposed over one of the conductive lines 118 or one of the conductive plates 114. The voltage return terminal may comprise a ground terminal or a negative voltage terminal, as examples, although alternatively, the voltage return terminal may comprise other signals or supply voltages. In some embodiments all of the conductive plates 114 are connected to the same voltage, e.g., ground or a negative voltage.

FIG. 6 shows an embodiment of the present invention wherein the conductive plates 214 of the isolation trenches 220 comprise a liner 210 of a conductive material. Like numerals are used for the various elements that were described in FIGS. 1 through 5. To avoid repetition, each reference number shown in FIG. 6 is not described again in detail herein. Rather, similar materials x02, x04, x06, etc . . . are preferably used to describe the various material layers shown as were used to describe FIGS. 1 through 5, where x=1 in FIGS. 1 through 5 and x=2 in FIG. 6. As an example, the materials and dimensions described for the conductive liner 110 in the description for FIGS. 1 through 5 may also be used for the conductive liner 210 shown in FIG. 6.

In the embodiment shown in FIG. 6, the conductive plates 214 in the lower portion of the recesses or trenches do not include a conductive fill material; rather, the conductive plates 214 comprise only a conductive liner 210. The conductive liner 210 may comprise one or more layers of conductive material. Rather than having a rectangular shape in a cross-sectional view as in the first embodiment shown in FIGS. 1 through 5, the conductive plates 214 comprise a U-shape, conforming to the shape of the lower portion of the recesses in the workpiece 202. The insulating material 216 fills in the interior portion of the U-shaped conductive plates 214, as shown. The conductive liner 210 may be thicker in this embodiment, as required to achieve the resistance needed for the conductive plates 214, for example. A deposition step for depositing a conductive fill material is advantageously avoided in this embodiment, for example.

After the formation of the conductive liner 210, the conductive liner 210 is removed from the upper portion of the recesses using an etch process. The insulating material 216 is then formed over the liner 210 in the lower portion of the recesses 208 and over the sidewalls of the recesses in the upper portion of the recesses, as shown.

FIG. 7 shows an embodiment of the present invention wherein a conductive liner 310 is formed only on a bottom surface of the isolation trenches 320. Again, like numerals are used for the element numbers shown in the previous figures, and to avoid repetition, each element number is not described again herein.

In the embodiments shown in FIGS. 1 through 6, the conductive liner 110 and 210 is disposed on a bottom surface and sidewalls of the recesses 108 in the lower portion of the recesses 108. However, in the embodiment shown in FIG. 7, the conductive liner 310 is disposed only on a bottom surface of the recess of the isolation trenches 320. The conductive liner 310 may be formed using a sputter or PVD process in this embodiment, for example. The sputter process or PVD process may result in the formation of the conductive liner 310 only on the bottom surface and not on the sidewall of the recesses in the workpiece 302, for example. The conductive fill material 312 is formed over the conductive liner 310, and the conductive plates 314 comprise the conductive fill material 312 and the conductive liner 310 over the bottom of the recesses in this embodiment, as shown.

Embodiments of the present invention are particularly advantageously when implemented in memory arrays comprising resistive elements comprising a phase change material, for example. Embodiments of the present invention may also be implemented in other types of memory arrays, or in arrays of other types of devices other than memory devices, as examples.

FIGS. 8 through 12 illustrate exemplary memory arrays in which the novel isolation trenches 120, 220, and 320 comprising conductive plates 114, 214, and 314 in a lower portion thereof may be implemented. Again, like numerals are used for the element numbers shown in the previous figures, and to avoid repetition, each element number is not described again herein. Referring next to FIG. 8, a perspective view of an embodiment of the present invention is shown implemented in a memory array comprising a phase change random access memory (PCRAM) including U-shaped bipolar transistors. FIG. 9 shows a cross-sectional view of a portion of the memory array shown in FIG. 8, and FIG. 10 shows a cross-sectional view of a portion of the memory array shown in FIGS. 8 and 9 rotated by ninety degrees.

The novel isolation trenches 420 comprising conductive plates 414 of embodiments of the present invention are illustrated in FIGS. 8 through 10 implemented in a memory array of a type described in U.S. patent application Ser. No. 12/033,519, filed on Feb. 19, 2008, entitled "Integrated Circuit Including U-Shaped Access Device"; and Ser. No. 12/033,533, filed on Feb. 19, 2008, entitled "Integrated Circuit Including U-Shaped Access Device", which applications are hereby incorporated herein by reference. The memory array includes cross-point memory cells that each includes a transistor 438 and a storage device 432. The transistors 438 comprise U-shaped vertical bipolar select devices that include a base 442 and an emitter 440. The memory cells include a storage device 432 comprising a resistive memory element coupled to the emitter 440 of the transistors 438. A metallized wordline 428 is electrically coupled to the base 442 of the transistors 438 through conductive material 436 and a fourth doped region 426. The transistors 438 may comprise a vertical U-shaped p-n-p bipolar transistors, for example. Alternatively, the transistors 438 may comprise vertical U-shaped n-p-n bipolar transistors, for example, not shown.

The semiconductor device 400 comprises a plurality of isolation trenches 420 comprising a plurality of conductive plates 414 that extend beneath the memory array, as previously described with reference to the embodiments shown in FIGS. 1 through 7 herein. The workpiece 402 in this embodiment includes a plurality of doped regions 404, 406, 424, and 426. For example, in the example shown, first doped region 404 comprises a p type region, second doped region 406 comprises an n− type region disposed beneath the first doped region 404, and third doped region 424 comprises a p type region disposed beneath the second doped region 406. A fourth doped region 426 is spaced apart from the first doped region 404 by an insulating material 446 which may comprise the same insulating material 416 of the isolation trenches 420 of embodiments of the present invention. The fourth doped region 426 may comprise an n+ type region, as shown.

A plurality of wordlines 428 and bitlines 430 positioned at substantially orthogonal directions to one another are disposed over the workpiece 402. A plurality of storage devices 432 comprising resistive elements are disposed between the wordlines 428 and bitlines 430, e.g., proximate active areas of the workpiece 402. The storage devices 432 utilize the resistance value of the resistive elements to store one or more bits of data. For example, a resistive element programmed to have a high resistance value may represent a logic "1" data bit value and a memory element programmed to have a low resistance value may represent a logic "0" data bit value.

The storage devices 432 may comprise resistive elements such as phase change elements (PCE's) comprising a material such as Ge—Sb—Te (GST), as an example, although other phase-changing materials and other types of resistive elements may also be used for the storage elements 432. The storage devices 432 may comprise PCE's comprising a phase change material including one or more of the elements Ge, Sb, Te, Ga, As, In, Se, Bi, and S, as examples, although other materials may also be used for the storage devices 432. Storage devices 432 comprising PCE's may include a phase change material that exhibits at least two different states. The states of the phase change material may comprise an amorphous state and a crystalline state, where the amorphous state involves a more disordered atomic structure and the crystalline state involves a more ordered lattice. The amorphous state usually exhibits higher resistivity than the crystalline state, for example.

The storage devices 432 are addressable for programming, sensing, or reading the programmed states using the wordlines 428, bitlines 430, and the active areas of the workpiece 402 comprising the first doped region 404, the second doped region 406, the third doped region 424, and the fourth doped region 426 of the workpiece 402.

The bitlines 430 are disposed over the storage elements 432, which are coupled to the first doped regions 404 of the workpiece 402 by contacts 434 comprising a conductive material. The wordlines 428 are disposed beneath the bitlines 430 and are coupled to the fourth doped regions 426 of the workpiece 402 by conductive features 436. The device may comprise a $4F^2$ cross-point cell, e.g., comprising an area of about 4 times the minimum feature size F×F of the semiconductor device 400 (e.g., see the labeled dimension "2F" in the perspective and cross-sectional views in FIGS. 8 and 9).

The conductive plates 414 are disposed in a plate level beneath a top surface of the workpiece 402. The wordlines 428 are formed in a conductive line level, e.g., a wordline level, over the top surface of the workpiece 402. The bitlines 430 are formed in a conductive line level, e.g., a bitline level, over the wordline level.

The insulating materials 416, 446, and 448 disposed between the various elements are not shown in the perspective view in FIG. 8, but are shown in the cross-sectional view in FIGS. 9 and 10. Insulating material 446 and 448 may comprise similar materials as described for the insulating material 416 of the novel isolation trenches 420 described herein, for example.

The first doped region 404, the second doped region 406, and the third doped region 424 of the workpiece 402 comprise a vertical doping profile that functions as a bipolar transistor, e.g., a bipolar junction transistor (BJT). For example, a schematic of a bipolar transistor is superimposed over a portion of the workpiece 402 at 438 in FIG. 8. The first doped region 404, the second doped region 406, the third doped region 424, and the fourth doped region 426 of the workpiece 402 together function as a U-shaped bipolar transistor, for example.

One side of storage devices 432 is electrically coupled to a bitline 430, and the other side of the storage devices 432 is electrically coupled to the emitter of the transistor 438, e.g., by contacts 434. The collectors of the transistors 438 are electrically coupled to common or ground. The bases of the transistors 438 are electrically coupled to a wordline 428.

The third doped region 424 of the workpiece 402 is electrically coupled to the conductive plates 414. The conductive plates 414 of embodiments of the present invention may be coupled to a return voltage terminal, such as ground, as shown in FIG. 8. When a storage device 432 comprising a memory device is selected, a current i is applied from a bitline 430 through the PCE 432 to the first doped region 404 which functions as an emitter of the bipolar transistors 438. A portion $i_2$ of the current i flows through the second doped region 406 to the third doped region 424 which functions as a collector of the bipolar transistors 438, which is coupled to ground by the conductive plate 414 of an isolation region 420 of embodiments of the present invention. A portion $i_1$ of the current i also flows from the second doped region 406 which functions as a base of the bipolar transistors 438 to the wordline 428.

Thus, a memory array may be operated in accordance with embodiments of the present invention by connecting the conductive plates 414 comprising the conductive material (e.g., material 110/112, 210, or 310/312) in the lower portion of the recesses of the isolation trenches 420 to a voltage return terminal, and accessing at least one of the memory devices comprising the storage devices 432 in the memory array. Accessing the memory devices may comprise reading from, writing to, or sensing the memory devices comprising the storage devices 432 that are coupled to the active areas, e.g., the bipolar transistor 438 formed in the workpiece 402 in the doped regions 404, 406, 424, and 426, for example.

The conductive plates 414 of the isolation trenches 420 may be coupled to a voltage return terminal comprising a ground terminal, to a negative voltage terminal, e.g., comprising about −1 volt or other negative voltage levels, or other voltage terminals comprising other voltage levels, as examples. The conductive plates 414 in the array may be coupled together at the edges of the array, as shown in the top view in FIG. 5, for example. The conductive plates 414 in the isolation trenches 420 of the array may be coupled to the same voltage, e.g., ground or a negative voltage in some embodiments. The conductive plates 414 of the isolation trenches 420 may be coupled to the same voltage return terminal comprising a ground terminal or negative voltage terminal that the collector or third doped region 424 is coupled to, advantageously providing a lower ohmic path for the current $i_2$, for example. The conductive material of the conductive plates 414 at the lower portion of the isolation trenches 420 provides a lower p-well resistance, e.g., for the third doped region 424.

The memory array shown in FIGS. 8 through 10 may include a controller, not shown, wherein the controller comprises a microprocessor, microcontroller, or other suitable logic circuitry for controlling the operation of memory array. The memory array may also include a write circuit and a sense circuit, also not shown. The controller is adapted to control read and write operations of memory array including the application of control and data signals to the memory array using the write circuit and the sense circuit, for example.

To write to and read the storage devices 432 in the memory array, several methods may be used. The write circuit may be adapted to provide voltage pulses through a signal path (not shown) and the bitlines 430 to memory cells, e.g., the storage devices 432, of the memory array to program the memory cells. Alternatively, the write circuit may be adapted to provide current pulses through a signal path and bit lines 430 to storage devices 432 in the memory array to program the storage devices 432. The sense circuit is adapted to read each of the two or more states of the storage devices 432 through the bitlines 430 and the signal path. The sense circuit may provide current that flows through a storage device, and the sense circuit may be adapted to read the voltage across that one of the storage devices 432. Alternatively, the sense circuit may provide a voltage across one of the storage devices 432, and the sense circuit may be adapted to read the current that flows through that one of the storage devices 432, for example. In other embodiments, the write circuit may be adapted to provide a voltage across or a current through one of the storage devices 432, and the sense circuit may be adapted to read the current that flows through or read the voltage across that one of the storage devices, for example. The sense circuit may also be used to determine or sense the resistance of the storage devices, as another example.

Figure 11:
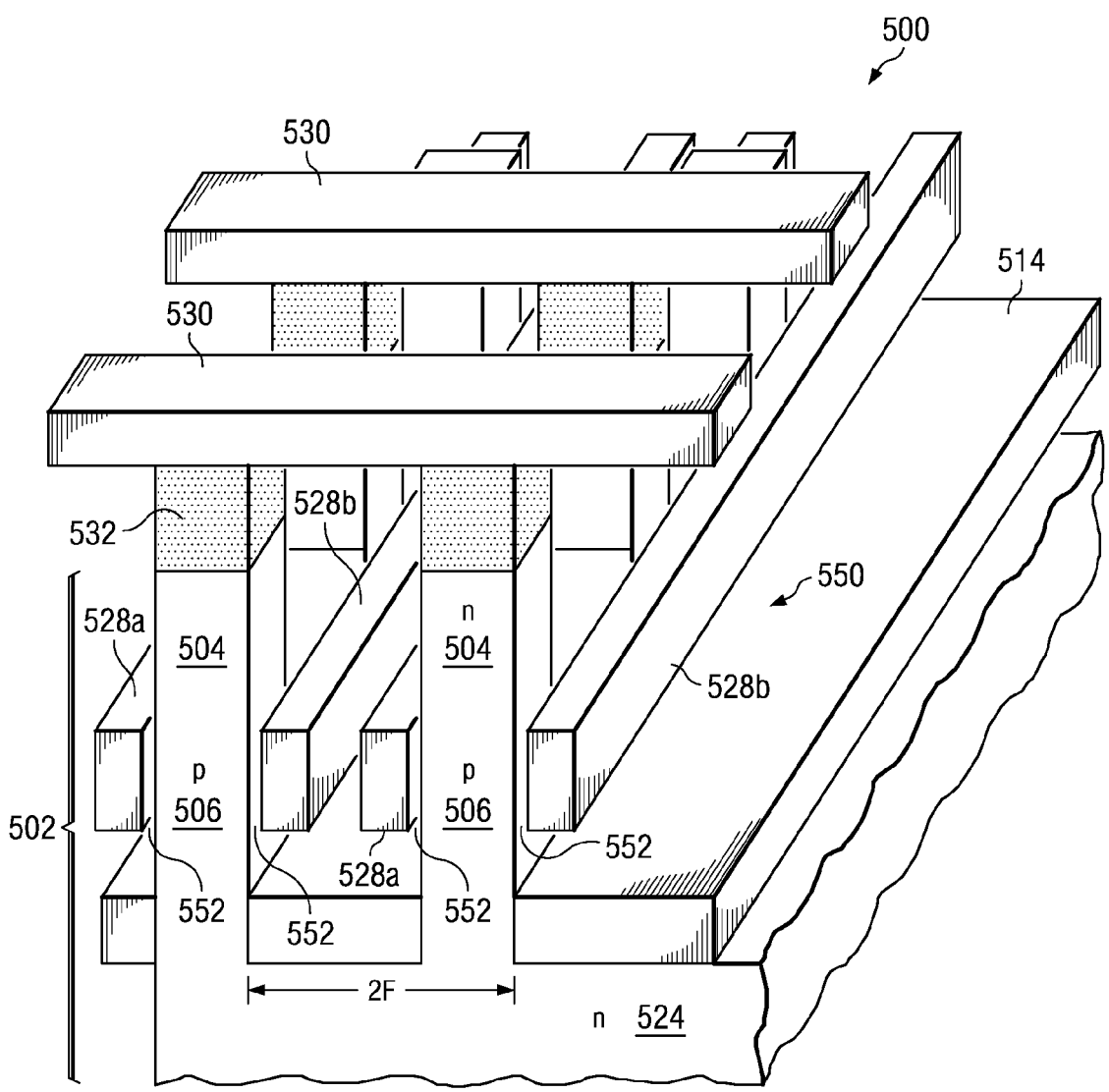
FIG. 11 shows an embodiment of the present invention implemented in a memory array including a PCRAM device including vertical field effect transistor select devices and having buried wordlines.

FIG. 11 shows an embodiment of the present invention implemented in a memory array including a PCRAM device including vertical select devices comprising transistors and having buried wordlines 528a and 528b. The novel isolation trenches comprising conductive plates 514 of embodiments of the present invention are illustrated in FIG. 11 implemented in a memory array of a type described in U.S. patent application Ser. No. 11/701,198, filed on Feb. 1, 2007, entitled "Resistive Memory Including Buried Wordlines", which application is incorporated herein by reference.

The select devices may comprise transistors 550 comprising spacer gate field effect transistors FET's 550 that may comprise a vertical n-p-n bipolar transistors, for example. Alternatively, the spacer FET's 550 may comprise vertical p-n-p bipolar transistors, for example, not shown. The memory array may comprise a FET array with double gates and double buried wordlines 528a and 528b.

The storage elements 532 comprising PCE's are disposed between the bitlines 530 and the first doped regions 504 of the workpiece 502. The wordlines 528a and 528b comprise buried metal spacer wordlines that are separated by an oxide material or insulating material in regions 552 from the second doped regions 506 that function as channel regions of the transistor 550. The wordlines 528a and 528b function as gates of the FETs 550. A buried metal wordline 528a and 528b may be disposed on both sides of the second doped regions 506 in the array, as shown; thus, the transistors 550 comprise double gate transistors. The first doped regions 504, the second doped regions 506, and the third doped region 524 comprise active areas of the workpiece 502 that function as spacer FETs 550 and provide accessibility to the storage elements 532, addressable using the wordlines 528a and 528b and bitlines 530, in this embodiment.

Figure 12:
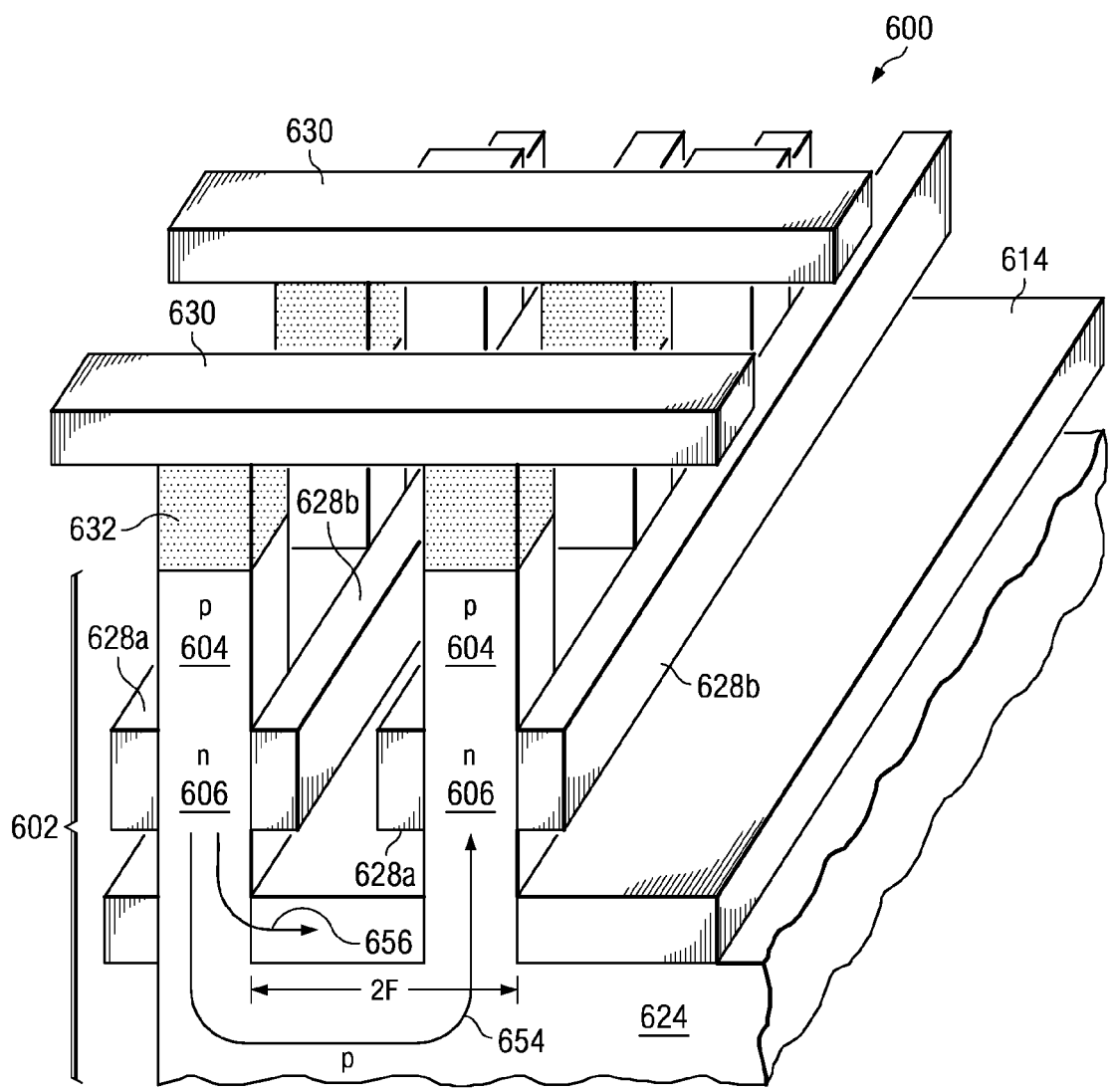
FIG. 12 shows an embodiment of the present invention implemented in a memory array including a PCRAM device including vertical bipolar select devices comprising diodes and having buried wordlines.

FIG. 12 shows an embodiment of the present invention implemented in a memory array including a PCRAM device including vertical bipolar select devices comprising diodes and having buried wordlines. The novel isolation trenches comprising conductive plates 614 of embodiments of the present invention are illustrated in FIG. 12 implemented in a memory array of a type also described in U.S. patent application Ser. No. 11/701,198, filed on Feb. 1, 2007, entitled "Resistive Memory Including Buried Wordlines", for example. The first doped region 604 and the second doped region 606 comprise active areas of the workpiece 602 that function as diodes and may be used to access the storage elements 632 using the buried wordlines 628a and 628b and the bitlines 630. A buried wordline 628a and 628b may be disposed on both sides of the second doped regions 606 in the array, as shown. In this embodiment, the buried wordlines 628a and 628b may be directly coupled to or connected to the second doped regions 606, for example. The storage elements 632 are disposed between the bitlines 630 and the first doped regions 604 of the workpiece 602.

Without the presence of the conductive plates 614 of the isolation trenches 620 in accordance with embodiments of the present invention, parasitic effects 654 may impact the closely-spaced active areas of the workpiece 602, e.g., the first doped regions 604, the second doped regions 606, and the third doped regions 624. Advantageously, the presence of the conductive plates 614 of the isolation trenches that are coupled to a voltage return terminal such as ground cause the parasitic effects which may comprise a current, indicated at 656 in FIG. 12, to flow to ground or another voltage return level rather than to impact an adjacent active area. Thus, the novel conductive plates 614 in the isolation trenches 620 suppress undesirable parasitic bipolar effects in the diode memory array shown in FIG. 12.

In the embodiments shown in the perspective views in FIGS. 11 and 12, the insulating materials are omitted so the conductive features and storage elements of the memory arrays may be more clearly seen. Insulating materials are included to separate the various features and elements, similar to the cross-sectional views shown in FIGS. 9 and 10, for example.

The memory arrays shown in FIGS. 11 and 12 may function and may be operated, e.g., read, written to, or sensed similar to the description for the embodiments shown in FIGS. 8 through 10, for example.

After the manufacturing processes described herein for the semiconductor devices 100, 200, 300, 400, 500, and 600, the manufacturing process for the semiconductor devices 100, 200, 300, 400, 500, and 600 is then continued to complete the fabrication of the devices 100, 200, 300, 400, 500, and 600. Insulating and encapsulating materials may be formed over the semiconductor devices 100, 200, 300, 400, 500, and 600. Metallization layers (not shown) comprising one or more conductive line and via layers may be formed over the workpieces 102, 202, 302, 402, 502, and 602 to interconnect the various components of the semiconductor devices 100, 200, 300, 400, 500, and 600. Contacts may be formed on the top surface over the insulating and metallization layers, for example, also not shown.

Embodiments of the present invention may be implemented in applications where memory devices are used, e.g., in memory arrays, as described herein and shown in FIGS. 8 through 12. The storage devices 432, 532, and 632 may comprise resistive elements such as PCEs, MRAM stacks, or TMO elements. Alternatively, the storage devices 432, 532, and 632 may comprise other types of memory devices, such as DRAMs, SRAMs, or flash memories, although other types of memory devices many also be used. The novel isolation trenches 120, 220, 320, 420, 520, and 620 comprising conductive plates 114, 214, 314, 414, 514, and 614 may also be implemented in other types of semiconductor device arrays.

The novel isolation trenches 120, 220, 320, 420, 520, and 620 comprising conductive plates 114, 214, 314, 414, 514, and 614 are particularly beneficial in memory arrays wherein a low ohmic well connection at the bottom of the isolation trenches 120, 220, 320, 420, 520, and 620 is needed, for example. The isolation trenches 120, 220, 320, 420, 520, and 620 comprising conductive plates 114, 214, 314, 414, 514, and 614 described herein are also particularly beneficial in memory arrays comprising very small ground rules or CDs.

Embodiments of the present invention include methods of forming isolation trenches 120, 220, 320, 420, 520, and 620 and methods of fabricating the semiconductor devices 100, 200, 300, 400, 500, and 600 including the isolation trenches 120, 220, 320, 420, 520, and 620 described herein, for example. Embodiments of the present invention also include semiconductor devices 100, 200, 300, 400, 500, and 600 and isolation trenches 120, 220, 320, 420, 520, and 620 manufactured using the methods described herein. Embodiments of the present invention also include methods of operating memory arrays including the novel isolation trenches 120, 220, 320, 420, 520, and 620 including the conductive plates 114, 214, 314, 414, 514, and 614.

Advantages of embodiments of the present invention include providing novel structures and methods for forming isolation trenches 120, 220, 320, 420, 520, and 620 of semiconductor devices 100, 200, 300, 400, 500, and 600. The novel isolation trenches 120, 220, 320, 420, 520, and 620 include a conductive material in a lower portion of the recesses, which comprise buried conductive plates 114, 214, 314, 414, 514, and 614 or conductive lines that function as low ohmic conductive plates 114, 214, 314, 414, 514, and 614 in semiconductor devices 100, 200, 300, 400, 500, and 600 such as memory arrays.

In some memory arrays, the amount of programming current required to program the storage devices 432, 532, and 532 may be relatively large, e.g., comprising several microamperes in some applications. The voltage drop from an edge of the array to the memory cells or storage devices 432, 532, and 632 may comprise several millivolts, for example. Embodiments of the present invention advantageously lower the voltage drop, e.g., by lowering the resistance by causing a portion of the programming current to pass through the novel conductive plates 114, 214, 314, 414, 514, and 614 of the novel isolation trenches 120, 220, 320, 420, 520, and 620 described herein.

As an example, a resistance of a wordline or bitline to a storage device 432, 532, or 632 to an edge of an array may comprise about 1 k$\Omega$, and the conductive plates 114, 214, 314, 414, 514, and 614 may lower the resistance to about 100$\Omega$. If the programming current is about 100 microamperes to switch a resistive element 432, 532, or 632 from one state to another, the voltage drop may be reduced using embodiments of the present invention from about 0.100 Volts to about 0.010 Volts, reducing the voltage drop across the memory array by a factor of about 10×.

Thus, power requirements for the memory array are reduced, and battery life, e.g., of batteries used to power the memory arrays, may be increased, in some applications. Alternatively, the memory array may be made larger and may be increased in size to include a larger number of storage cells 432, 532, or 632, for example.

Embodiments of the present invention are easily implementable in existing manufacturing process flows, with a small or reduced number of additional processing steps being required, for example. Embodiments of the present invention are particularly beneficial in technology nodes having very small minimum feature sizes, such as about 45 nm and below, for example. Alternatively, embodiments of the present invention may also be implemented in applications having ground rules larger than about 45 nm.

Other advantages of embodiments of the present invention include enabling chip size increase due to low ohmic wiring options in an array. The conductive plates in the isolation trenches suppress or prevent latch-up and other cross-talk effects. Embodiments of the present invention improve reliability of semiconductor devices, as a conductive plate instead of a wordline or bitline in an array carries away some of the array current, e.g., in the use of a bipolar transistor or a FET with a metal or conductive plate in a memory device, or with a diode array, as shown in FIG. 12.

The conductive plates 114, 214, 314, 414, 514, and 614 of the isolation trenches 120, 220, 320, 420, 520, and 620 comprise low ohmic plate connections disposed beneath or under a memory array. The array may comprise crystalline silicon (e.g., the workpiece 102 may comprise crystalline silicon) without requiring an epitaxial growth of semiconductive material above the conductive plates 114, 214, 314, 414, 514, and 614. For example, in the embodiment shown in FIGS. 8 through 10, the conductive plates 414 suppress parasitic bipolar effects between storage devices 432 or memory cells.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an isolation trench, the method comprising:
    forming at least one recess within a top portion of a workpiece;
    forming a metallic liner in a lower portion of the at least one recess;
    forming a conductive fill material in the lower portion of the at least one recess, the conductive fill material disposed over the metallic liner; and
    forming an insulating material in an upper portion of the at least one recess over the conductive fill material and the metallic liner.

2. The method according to claim 1, wherein forming the at least one recess comprises forming a layer of photosensitive material over the workpiece, patterning the layer of photosensitive material using lithography, etching away the top portion of the workpiece, and removing the layer of photosensitive material.

3. The method according to claim 2, further comprising forming a pad nitride or a hard mask over the workpiece, before forming the layer of photosensitive material over the workpiece, wherein etching away the top portion of the workpiece further comprises etching away a portion of the pad nitride or the hard mask.

4. The method according to claim 1, wherein forming the conductive fill material in the lower portion of the at least one recess comprises filling the at least one recess with the conductive fill material, and etching away the conductive fill material in the upper portion of the at least one recess.

5. The method according to claim 1, wherein forming the insulating material in the upper portion of the at least one recess over the conductive material comprises overfilling the at least one recess, and planarizing the workpiece, removing a portion of the insulating material from over a top surface of the workpiece.

6. The method according to claim 1, wherein forming the conductive fill material comprises forming a conductive plate having a lower resistance than a portion of the workpiece proximate the lower portion of the at least one recess.

7. The method according to claim 1, the metallic liner is disposed only on a bottom surface of the at least one recess.

8. The method according to claim 1, wherein the conductive liner is disposed on a bottom surface and sidewalls of the recess in the lower portion of the at least one recess.

9. The method according to claim 1, wherein the insulating material comprises aluminum oxide.

10. The method according to claim 1, wherein the insulating material comprises an oxide material, a nitride material, or a low dielectric constant (k) dielectric material.

11. The method according to claim 1, wherein the conductive fill material comprises a material selected from the group consisting of W, WN, WSi, Ti, TiN, Ta, TaN, Ru, Pt, and Ir.

12. The method according to claim 1, wherein the conductive fill material comprises a material selected from the group consisting of carbon, polysilicon, a silicided semiconducting material, and combinations thereof.

13. The method according to claim 1, wherein the workpiece comprises a first doped region and a second doped region beneath the first doped region, the second doped region having an opposite conductivity type than the first doped region.

14. The method according to claim 13, wherein forming at least one recess comprises forming a recess through the first doped region and into the second doped region.

15. A method of forming an isolation trench, the method comprising:
    forming a recess within a top portion of a workpiece having a first doped region and second doped region, the first doped region being disposed over the second doped region and comprising a conductivity type opposite to the second doped region, wherein the recess extends from a top surface of the first doped region through a bottom surface of the first doped region into the second doped region, wherein the recess comprises an upper portion and a lower portion, the lower portion of the recess extending from a plane below the bottom surface of the first doped region to a bottom surface of the recess;
    forming a conductive material in the lower portion of the recess; and
    forming an insulating material in an upper portion of the recess over the conductive material.

16. The method according to claim 15, wherein the conductive material comprises a conductive liner and a conductive fill material.

17. The method according to claim 16, wherein the conductive liner is formed on the bottom surface of the recess and on sidewalls of the lower portion of the recess, and wherein the conductive fill material is formed over the conductive liner.

18. The method according to claim 16, wherein the conductive liner is formed only on the bottom surface of the recess and not on sidewalls of the recess, and wherein the conductive fill material is formed over the conductive liner.

19. The method according to claim 15, wherein the conductive material comprises only a conductive liner and the insulating material is formed directly on a top surface of the conductive liner.

20. The method according to claim 15, wherein the insulating material comprises aluminum oxide.

21. The method according to claim 15, wherein the insulating material comprises an oxide material, a nitride material, or a low dielectric constant (k) dielectric material.

22. The method according to claim 15, wherein the conductive material comprises a material selected from the group consisting of W, WN, WSi, Ti, TiN, Ta, TaN, Ru, Pt, and Ir.

23. A method of forming an isolation trench, the method comprising:
    forming a recess within a top portion of a workpiece having a first doped region and second doped region, the first doped region being disposed over the second doped region and comprising a conductivity type opposite to the second doped region, wherein the recess extends from a top surface of the first doped region through a bottom surface of the first doped region into the second doped region, wherein a upper portion of the recess extends from the top surface of the first doped region to a plane below the bottom surface of the first doped region, and wherein a lower portion of the recess extends from the plane below the bottom surface of the first doped region to a bottom surface of the recess;

forming a metallic liner in the lower portion of the recess;

forming a conductive fill material in the lower portion of the recess, the conductive fill material disposed over the metallic liner; and forming an insulating material in an upper portion of the recess over the conductive fill material and the metallic liner.

24. The method according to claim 23, the metallic liner is disposed only on the bottom surface of the recess but not on sidewalls of the recess.

25. The method according to claim 23, wherein the conductive liner is disposed on the bottom surface of the recess and sidewalls in the lower portion of the recess.

26. The method according to claim 23, wherein the insulating material comprises a low dielectric constant (k) dielectric material.

27. The method according to claim 23, wherein the conductive fill material comprises a material selected from the group consisting of W, WN, WSi, Ti, TiN, Ta, TaN, Ru, Pt, Ir, carbon, polysilicon, a silicided material.

28. The method according to claim 23, wherein the conductive fill material is conductively coupled to the second doped region through the metallic liner.

* * * * *